United States Patent [19]

Boston

[11] Patent Number: 4,603,100

[45] Date of Patent: Jul. 29, 1986

[54] SILVER IMAGE ENHANCEMENT COMPOSITION AND PROCESS FOR USE THEREOF

[75] Inventor: David R. Boston, Woodbury, Minn.

[73] Assignee: Minnesota Mining and Manufacturing Company, St. Paul, Minn.

[21] Appl. No.: 711,765

[22] Filed: Mar. 14, 1985

[51] Int. Cl.$^4$ .................. G03C 5/54; G03C 5/00
[52] U.S. Cl. .................. 430/204; 430/205; 430/331; 430/463
[58] Field of Search .............. 430/204, 205, 331, 461, 430/463, 449

[56] References Cited

U.S. PATENT DOCUMENTS

| | | | |
|---|---|---|---|
| 3,770,437 | 11/1973 | Brugger et al. | 430/461 |
| 3,807,304 | 4/1974 | Gracia et al. | 101/463 |
| 3,807,305 | 4/1974 | Gracia et al. | 101/463 |
| 3,809,562 | 5/1974 | Gracia et al. | 96/33 |
| 3,830,649 | 8/1974 | Gracia et al. | 96/86 |
| 3,862,843 | 1/1975 | Lerner | 96/76 |
| 3,904,412 | 9/1975 | Serrien et al. | 430/204 |
| 3,973,967 | 8/1976 | Lerner | 96/48 |
| 3,989,526 | 11/1976 | Bissonette | 96/48 |
| 4,062,682 | 12/1977 | Laridon et al. | 430/204 |
| 4,172,726 | 10/1979 | Nakamura et al. | 430/461 |
| 4,444,873 | 4/1984 | Ishikawa et al. | 430/461 |

*Primary Examiner*—Mary F. Downey
*Attorney, Agent, or Firm*—Donald M. Sell; James A. Smith; David L. Weinstein

[57] ABSTRACT

Composition and process for enhancing silver images. A composition comprising an oxidizing agent for metallic silver and a silver ion insolubilizing agent is reacted with photographically produced silver deposits. The composition and process is particularly useful in enhancing the lithographic utility of photographically produced silver deposits which function as the inkable image area of lithographic printing plates.

11 Claims, No Drawings

SILVER IMAGE ENHANCEMENT COMPOSITION AND PROCESS FOR USE THEREOF

BACKGROUND OF THE INVENTION

This invention relates to a composition and process for enhancing silver images, and, more particularly, for enhancing photographically produced silver images for use in lithography.

In the silver salt diffusion transfer process, an imagewise exposed silver halide emulsion layer is positioned in intimate contact with a receptor element and developed with a silver halide developing composition in the presence of a solvent for silver halide such that the unexposed silver halide is dissolved and subsequently diffused into the receptor element. Development nuclei, or catalyst, contained in the receptor element, cause the diffusing silver halide to be reduced (i.e., developed) to metallic silver, thereby forming an image on the surface of the receptor element.

As applied to the photolithographic process, a developing composition containing a developing agent, e.g., hydroquinone, a solvent for silver halide, e.g., the thiosulfate ion, and, preferably, an antifoggant, e.g., benzotriazole, is used. When the imagewise exposed silver halide emulsion layer is contacted with the developing composition, the exposed silver halide grains are reduced to silver metal in normal fashion. They remain immobilized in the emulsion layer. The unexposed silver halide grains dissolve in the developing composition via formation of soluble silver complexes, such as the complexes of silver thiosulfate. When the soluble silver complex contacts a development nuclei or catalyst in the receptor element, the silver ion is reduced to a metallic deposit which can then form the ink receptive image areas of a lithographic plate.

There are many variations on this theme, such as: some or all of the developer may be initially incorporated within the plate structure; the plate may contain either a positive or negative silver halide emulsion; the development nuclei or catalyst-containing layer may be on a separate support or receptor element and brought into intimate contact with the silver halide emulsion after being wet with developer composition, following which the two separate supports are peeled apart; a receiving layer containing development nuclei or catalyst can be contained as an intermediate layer between the initial support and the silver halide emulsion, such as is taught in U.S. Pat. No. 4,204,868; or the receptor layer can be contained on top of the silver halide emulsion layer, as is taught in U.S. Pat. Nos. 3,728,114 and 4,160,670.

If the silver halide emulsion layer is placed between the support and the catalyst layer, then the portions of the plate where the silver image is not bared are composed of protective colloids such as gelatin, polyvinyl alcohol, etc. and are hydrophilic while the portions where the silver image is bared are oleophilic due to the deposited silver and thus have an affinity to ink. If the catalyst layer is placed between the support and the silver halide emulsion layer, then the emulsion layer is subsequently removed to reveal a positive silver image on the catalyst layer. A hydrophilic support is used to provide the required lithographic differential.

One shortcoming of the silver diffusion transfer process is that a substantial level of silver halide is required to provide a positive silver image of sufficient oleophilicity to function as a lithographic plate. Another shortcoming is that there is often insufficient oleophilic/hydrophilic differential between the image areas and background areas of the lithographic plate.

There have been several attempts in the prior art to increase oleophilicity and thus improve lithographic functionality of plates produced by the silver diffusion transfer process. One means of increasing oleophilicity, silver amplification, is typically provided by a "redox" solution in which an oxidizing agent and a reducing agent are placed together. These agents are chosen so that the rate of spontaneous reaction between them will be slow except in the presence of a catalyst (silver) which increases the rate of spontaneous reaction dramatically. Consequently, reaction will tend to occur mainly in areas where catalyst is present, and if one or more of the redox reaction products becomes insolubilized, a build-up of oleophilic solid material will occur in those areas.

However, all catalytically activated redox processes suffer from the same problem—since the reaction ingredients (oxidizing agent and reducing agent) are thermodynamically unstable toward one another in the presence of a catalyst, contamination by the catalyst will cause rapid degradation of the processing solution. In addition, most such solutions contain oxidizing agents and reducing agents which are thermodynamically unstable toward one another even in the absence of a catalyst. Many processing solutions suffer from still another problem in that the products of spontaneous reaction between the oxidizing and reducing agents act as catalysts which further accelerate the spontaneous reaction. This is known as autocatalytic degradation.

SUMMARY OF THE INVENTION

This invention involves a composition and method for enhancing or improving the lithographic utility of photographically produced silver deposits which function as the inkable image areas of lithographic printing plates. The method requires the use of a composition comprising an oxidizing agent for metallic silver and a silver ion insolubilizing agent, which composition reacts with the aforementioned silver deposits to:

(1) oxidize the silver to the ionic (+1) state;
(2) redeposit the ionic silver in situ as an insoluble silver salt, e.g. silver iodide;
(3) deposit in the same areas, the oxidizing agent, in its reduced form, as it reacts with the silver deposits.

Thus, instead of only metallic silver in the lithographic image areas, there are also ionic silver, iodide ion, or other silver ion insolubilizing agent, and the reduced form of the oxidizing agent. This increased amount of material in the lithographic image areas serves to increase the lithographic utility of these areas by making them either tougher or thicker, or both, or allow a decrease in the amount of silver required to impart lithographic functionality (inkability) to the image areas.

The key advantage of the present invention is that the amount of silver halide required to produce a functional silver diffusion transfer lithographic plate is substantially reduced.

DETAILED DESCRIPTION

The image enhancement composition of the present invention comprises an oxidizing agent for metallic silver and a silver ion insolubilizing agent. The oxidizing agent is a transition-metal complex wherein the metal is cationic and can exist, in aqueous solution, in at least two cationic oxidation states. In these metal complexes, the metal ion is not in the lowest oxidation state, and the metal ion exists in solution as a chelate-type complex ion or molecule, i.e. the metal ion is surrounded by or attached to one or more organic radicals, or one or more ions, hereinafter referred to as ligands, which are chemically bonded to the metal ion. Preferred metal ions are ferric ($Fe^{+++}$) and cupric ($Cu^{++}$). At least one ligand must be a derivative of pyridine, phenol, or furan, which derivative must have the oxime (—CH=N—OH) substituent group in the 2-position. This ligand must be bonded to the metal ion at at least two bonding sites of the metal ion. In structural terms, the organic radical is derived from a molecule selected from

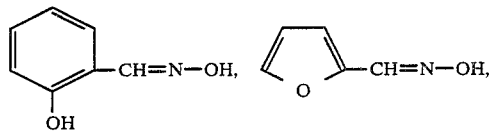

The nitrogen or oxygen atoms on the pyridine, phenol, or furan ring will be one of the bonding atoms. The second bonding atom will be a nitrogen or oxygen atom contained in the substituent group in the 2-position.

The oxygen or nitrogen bonding atoms of the phenol, furan, or pyridine derivative are structurally arranged in the ligand so that a 5- or 6-membered chelate ring is formed by direct bonding of the bonding atoms of the derivative to the metal ion.

A second class of ligands suitable for the metal complex, but not required, comprises chelating ligands derived from pyridine, phenol, or furan by substitution in the 2-position with either the Schiff's base (—C=N—) functional group or the carboxylic acid group

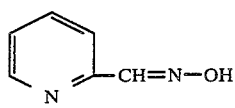

These ligands can be represented by the following structural formulas:

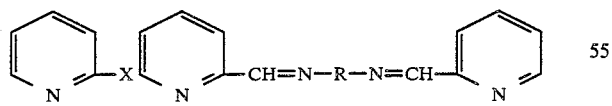

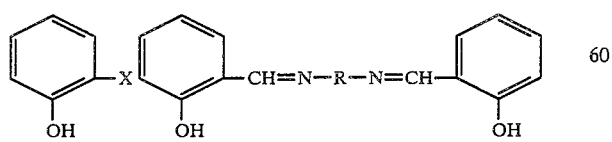

wherein X is selected from the group consisting of

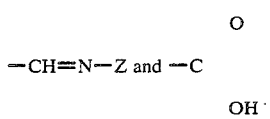

Z is an alkyl radical, preferably a lower alkyl radical, e.g., methyl, ethyl,

R is an alkylene radical $(CH_2)_n$, where n=1 to 20, inclusive, preferably where n=1 to 4, inclusive.

Examples of these ligands are:

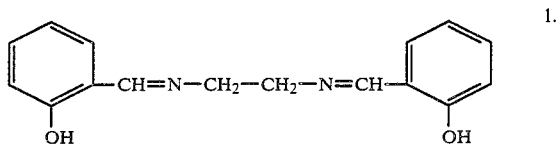

1.

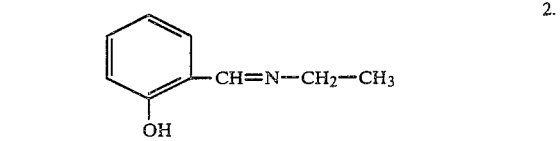

2.

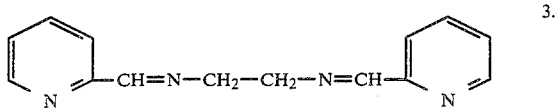

3.

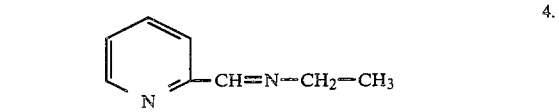

4.

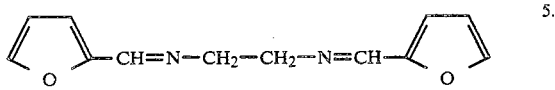

5.

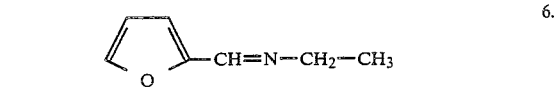

6.

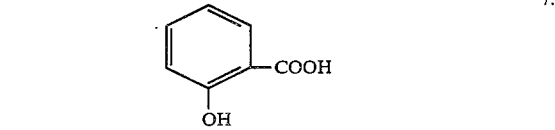

7.

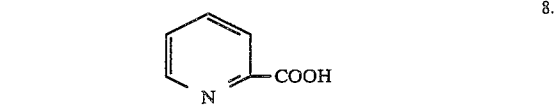

8.

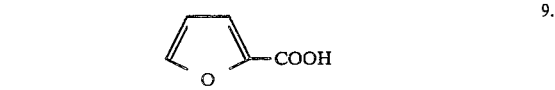

9.

A third class of ligands suitable for the metal complex comprises the weak hydroxy acids listed in the "Handbook of Chemistry and Physics", 46 Ed., Chemical Rubber Co., Cleveland, 1966, pp. D-78, 79. Generally, compounds from this class are added to the composition of the present invention to function as acid buffers. The pKa of the weak acid should be about 3.0 or higher.

Representative examples of these acids include citric acid and tartaric acid.

A fourth class of ligands suitable for the metal complex include halide ions, e.g. chloride, bromide, iodide ions.

The preferred required ligand is 2-pyridine-aldoxime

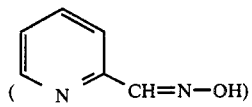

because it provides the best combination of stability and reactivity. When 2-pyridinealdoxime is used, it is preferred that the other ligands be picolinic acid

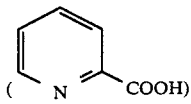

and furoic acid

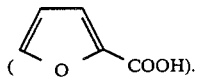

The —COOH functionality of these acids provides both improvement in water solubility and buffering activity which in turn provides the optimum environment for reaction with silver.

Silver ion insolubilizing agents are selected from compounds that provide a source of halide ion. Sources of iodide ion are the preferred silver ion insolubilizing agents. Sources of bromide ion can also be utilized. Representative examples of sources of halide ion include alkali metal halides, e.g. sodium halides, and acid halides, e.g. hydrogen halides.

Solvents that are suitable for the composition are those having an —OH group, e.g. water, alcohols, e.g. monohydric alcohols having 1 to 6 carbon atoms, polyols, and mixtures thereof. Preferred solvents include mixtures of water and a lower alcohol, e.g. n-propanol, and mixtures of water, lower alcohol, and a glycol (e.g. dipropyleneglycol).

The pH of the enhancement composition of this invention is preferably from pH 1.0 to pH 2.5, with a pH of less than 2.0 being especially preferred. Weak acids, e.g. sorbic, boric, benzoic, citric, tartaric, can be used to provide a low pH value. Iodide ion can be added in the form of hydroiodic acid instead of in the form of an iodide salt to help provide a low pH (under 2.5).

Enhancement of the silver image of a printing plate by the process of this invention is explained below. A silver halide printing plate is subjected to imagewise exposure and then treated with a mono-bath diffusion transfer developer containing a solvent for silver halide, e.g., 3M 'XL' Developer, for 30 seconds to one minute to obtain an offset printing image. The enhancement composition is then applied to the offset printing image by any suitable means, such as, for example, pouring a solution over the image or dipping the imaged plate into a bath of the solution.

While not wishing to be bound by any theory, it is believed that photographically produced silver in a binder matrix (e.g. gelatin, colloidal silica) is oxidized by the enhancement solution. The oxidized silver is transported to the surface of the binder matrix and is deposited thereon as an insoluble salt or complex. The reduced form of the oxidizing agent for silver has limited solubility in the reaction solvent and small quantities of it remain in the binder matrix at or near the surface. Because the oxidizing agent is a metal complex ion, it contains organic radicals which, as part of the metal complex, will be precipitated upon chemical reduction of the metal ion. These organic radicals can contribute oleophilic characteristics to the image areas mentioned above.

In addition to the foregoing, it often occurs that some of the silver in the aforementioned lithographic silver image areas (before reaction) is not on the surface (i.e., the top 100 to 150 nanometers) of the lithographic receptor element, but is "buried" just under the surface. In such cases the oxidizing solution described above serves to concentrate this "buried" silver at the surface of the receptor element. This further enhances the lithographic utility of the aforementioned image areas. The new material in the image areas continues to be strongly bound to the lithographic receptor sheet.

The total amount of material at the surface of the receptor element in the image areas after reaction is increased by a factor of two to twelve times over the amount of material which would have been in the same areas in the absence of the enhancement reaction. The oxidized silver and other material at the surface of the binder matrix are oleophilic and strongly adhere to the binder matrix.

In each of the following examples, the ingredients were always added in the order listed. Image enhancement was evaluated by the following procedure:

A 3M 'XL' Camera Plate silver halide printing plate was exposed in a camera to an image pattern, and subsequently developed in a diffusion transfer developer (3M 'XL' Developer). The developing process created a negative image in the silver halide emulsion layer and a corresponding positive image on the surface of the plate. This positive image was revealed by washing off the negative image (which was contained in an unhardened gelatin layer) with hot water. The partially processed plate is referred to herein as a "photoprint".

In the photoprints used for the testing procedures of the present invention, the exposure was adjusted to yield silver deposits on the plate surface in the range 0.2 to 0.4 g/m² of image area. This amount was lower than the amount of silver which must be deposited on the plate surface in order to make a normal functional XL plate. Lower levels of deposited silver were employed for the testing procedure for two reasons:

(1) to show that amounts of silver normally insufficient for plates are indeed sufficient when enhanced according to the present invention;
(2) to show the pronounced visual effects provided by the enhancement of the silver images.

The enhancement solution was applied to a partially processed 3M 'XL' Camera Plate for about 30 seconds to about two minutes. The plate was then washed with water and blotted dry.

Typically, when the solutions set forth in the examples were applied, the silver image areas of the photoprint were changed from a light gray color with no differential in reflectivity relative to the background areas to brightly colored image areas with a dramatic increase in gloss or shininess relative to the background areas. The particular colors depended on the various organic compounds used as ligands to prepare the metal complex.

EXAMPLE 1

The following ingredients were used to prepare a lithographic silver enhancement solution.

| Ingredient | Amount |
|---|---|
| Distilled water | 250.0 g |
| Methanol | 200.0 g |
| $Fe(NO_3)_3 \cdot 9H_2O$ | 4.04 g |
| Dimethylglyoxime | 2.32 g |
| 2-Pyridinealdoxime | 1.22 g |
| Sodium iodide (NaI) | 1.50 g |

The ingredients were first dissolved in methanol, and then water was added. An intense red colored solution was obtained. Shiny pink-red image areas were obtained at an immersion time of 30 seconds. Press testing indicated excellent image retention and clean background. A corresponding XL Camera Plate had no inking differential. The pink-red image obtained by reaction of the above solution with a photoprint was compared by two analytical techniques to the corresponding image area of an identical photoprint which had not been contacted with the solution. These techniques were electron microscopy and secondary ion mass spectrometry.

1. Electron microscopy

Cross-sectional electron micrograph pictures of the two samples at 54,400X magnification clearly showed that much more material was present at the surface of the pink image than at that of the original photoprint.

2. Secondary Ion Mass Spectrometry (SIMS)

The material at the surfaces of the samples was ablated and analyzed as a function of time on the SIMS instrument to yield information on the density of various materials as a function of depth from the surfaces. This analysis showed the following differences between the enhanced and unenhanced surfaces.

(a) The quantity of silver at the surface of the enhanced sample was two to three times that at the surface of the unenhanced sample;
(b) Iron was present at the surface of the enhanced sample;
(c) Iodide ion was present at the surface of the enhanced sample;
(d) Carbon-containing material was present at the surface of the enhanced sample.

EXAMPLE 2

The following ingredients were used to prepare a lithographic silver enhancement solution.

| Ingredient | Amount |
|---|---|
| Distilled water | 500.0 g |
| $Fe(NO_3)_3 \cdot 9H_2O$ | 4.04 g |
| 1,2 bis(salicyliminato)ethane | 2.68 g |
| Dimethylglyoxime | 1.16 g |
| Sodium hydroxide (NaOH) | 0.40 g |
| NaI | 6.00 g |

Upon adding all ingredients, a dark red solution was obtained, along with a small amount of precipitate. The mixture was tested for image enhancement capabilities. Shiny gold-red image areas were obtained at an immersion time of about five minutes. A high level of halftone dot retention was noted upon press testing. A small amount of ink in the non-image areas was removed by wiping. A corresponding XL Camera Plate displayed no differential inking.

EXAMPLE 3

The following ingredients were used to prepare a lithographic silver enhancement solution.

| Ingredient | Amount |
|---|---|
| Distilled water | 500.0 g |
| $CuCl_2 \cdot 2H_2O$ | 1.70 g |
| Dimethylglyoxime | 1.16 g |
| NaOH | 0.40 g |
| NaI | 1.50 g |

Upon adding all ingredients, a red-brown solution was obtained, along with a dark precipitate. The mixture was stirred for one hour and then tested for image enhancement capabilities. A shiny, yellow image was obtained on the plate surface at an immersion time of about two minutes. The yellow-imaged photoprint was tested for printing efficiency by moistening with XL Starter Solution (a commercial product used to wet the surface prior to printing to facilitate inking differential between image and background areas), mounting, and running on a Chief 15 lithographic printing press. More of the halftone dots on the plate image were inked than was possible with a corresponding XL Camera Plate containing the same amount of silver.

EXAMPLE 4

The following ingredients were used to prepare a lithographic silver enhancement solution.

| Ingredient | Amount |
|---|---|
| Distilled water | 300.0 g |
| Dipropylene glycol | 100.0 g |
| n-Propyl alcohol | 100.0 g |
| $FeCl_3 \cdot 4H_2O$ | 4.05 g |
| 2-Pyridinealdoxime | 1.83 g |
| Picolinic acid | 1.85 g |
| Furoic acid | 1.68 g |
| Hydriodic acid | 4.08 g |
| Sorbic acid | 5.00 g |

Reaction of the above solution with silver images on the photoprint described above produced shiny, red-pink deposits in about 20 seconds. One liter of the solution could be used to process over 50 square feet of photoprint material. The solution was usable for more than 12 weeks, with the color of the reacted silver image changing with the age of the solution from pink-red to yellow, but with the characteristic shininess still remaining. After 50 square feet of material had been processed and/or 12 weeks had passed, the processed material still passed a lithographic printing test, showing good lithographic differential between the image and background areas, and producing over 3000 good quality copies.

EXAMPLE 5

The following ingredients were used to prepare a lithographic silver enhancement solution.

| Ingredient | | Amount |
| --- | --- | --- |
| SOLUTION A: | Distilled water | 300.0 g |
| | FeCl$_3$.4H$_2$O | 4.05 g |
| | Picolinic acid | 1.85 g |
| | Furoic acid | 1.68 g |
| SOLUTION B: | n-Propyl alcohol | 100.0 g |
| | Dipropylene glycol | 100.0 g |
| | 2-Pyridinealdoxime | 1.83 g |
| | Hydriodic acid | 4.08 g |
| | Sorbic acid | 5.00 g |

Solution A was mixed with Solution B and the mixture allowed to stand five minutes. The results were the same as in the previous example. After being stored at room temperature for four years, Solutions A and B could still be combined to form the silver image enhancement solution, with the performance thereof being substantially similar to that of freshly prepared enhancement solution.

Various modifications and alterations of this invention become apparent to those skilled in the art without departing in the spirit and scope of this invention, and it should be understood that this invention is not to be limited to the illustrative embodiments set forth herein.

What is claimed is:

1. A composition for enhancing photographically produced silver images comprising
    (a) an oxidizing agent for metallic silver, said oxidizing agent comprising a transition-metal complex wherein said transition-metal is cationic and can exist in at least two cationic oxidation states, said cationic transition-metal being bonded to at least one ligand selected from the group consisting of

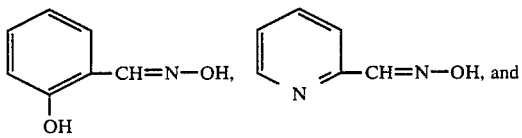

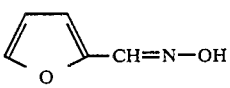

at least two bonding sites of said metal ion,
    (b) a silver ion insolubilizing agent, said insolubilizing agent comprising a source of halide ion, and
    (c) a solvent for (a) and (b).

2. The composition of claim 1 wherein said transition-metal is selected from the group consisting of Fe$^{+++}$ and Cu$^{++}$.

3. The composition of claim 1 wherein the bonding atoms in said ligand which bond to said metal ion are selected from oxygen and nitrogen atoms, and said oxygen or nitrogen atoms are arranged so that a 5- or 6-membered ring can be formed by direct bonding of said bonding atoms to said metal ion.

4. The composition of claim 1 further including a ligand selected from the group consisting of

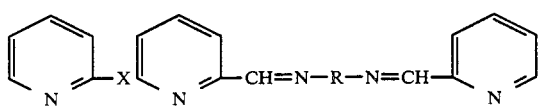

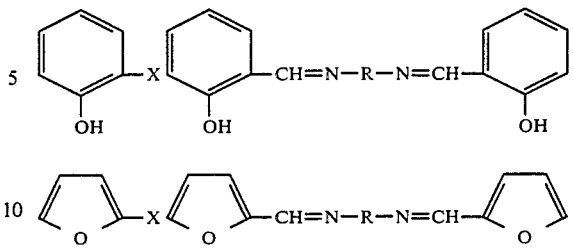

wherein
X is selected from the group consisting of $$-CH=N-Z \text{ and } -C\begin{smallmatrix}O\\\diagup\\\diagdown\\OH\end{smallmatrix}$$

Z is an alkyl radical, and
R is an alkylene radical.

5. The composition of claim 1 further including a ligand selected from the group consisting of halide ions and weak hydroxy acids.

6. The composition of claim 1 further including a weak hydroxy acid.

7. The composition of claim 1 wherein said halide ions are iodide ions.

8. The composition of claim 1 wherein said solvent comprises water.

9. The composition of claim 8 wherein said solvent further comprises a hydroxy-functional hydrocarbon.

10. A method for providing enhanced photographically-produced silver deposits which function as the inkable image areas of lithographic printing plates comprising the steps of:
    (a) imagewise exposing a silver halide printing plate,
    (b) treating the printing plate with a diffusion transfer developer containing a solvent for silver halide to obtain a silver image, and
    (c) applying to the silver image a composition comprising
    (1) an oxidizing agent for metallic silver, said oxidizing agent comprising a transition-metal complex wherein said transition-metal is cationic and can exist in at least two cationic oxidation states, said cationic transition-metal being bonded to at least one ligand selected from the group consisting of

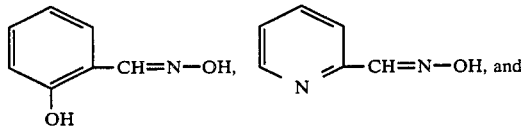

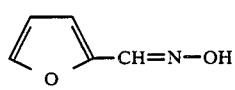

at least two bonding sites of said metal ion,
    (2) a silver ion insolubilizing agent, said insolubilizing agent comprising a source of halide ion, and
    (3) a solvent for (1) and (2).

11. In a method for the preparation of a lithographic plate comprising the steps of (a) contacting an imagewise exposed silver halide emulsion layer with a receptor element, (b) developing said imagewise exposed silver halide emulsion layer with a silver halide developing composition in the presence of a solvent for silver halide such that the unexposed silver halide is dissolved and subsequently diffuses into the receptor element where development nuclei contained in the receptor element cause the diffusing silver halide to be reduced to metallic silver to form an image on the surface of the receptor element, the improvement wherein said metallic silver image is treated with a composition comprising (1) an oxidizing agent for metallic silver, said oxidizing agent comprising a transition-metal complex wherein said transition-metal is cationic and can exist in at least two cationic oxidation states, said cationic transition-metal being bonded to at least one ligand selected from the group consisting of

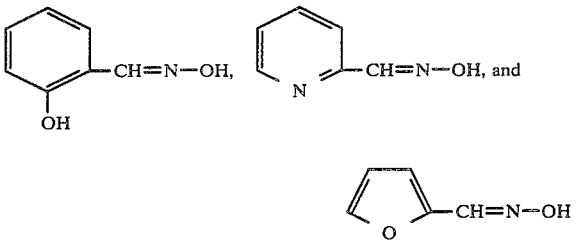

at least two bonding sites of said metal ion, (2) a silver ion insolubilizing agent, said insolubilizing agent comprising a source of halide ion, and (3) a solvent for (a) and (b).

* * * * *

UNITED STATES PATENT AND TRADEMARK OFFICE
CERTIFICATE OF CORRECTION

PATENT NO. : 4,603,100
DATED : July 29, 1986
INVENTOR(S) : David R. Boston

It is certified that error appears in the above-identified patent and that said Letters Patent is hereby corrected as shown below:

Col. 3, line 45, "(-C O OH)" should read -- 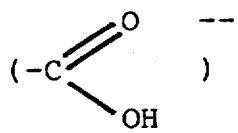 --

Col. 4, line 5, "-CH=N-Z and -C O OH" should read -- -CH=N-Z and 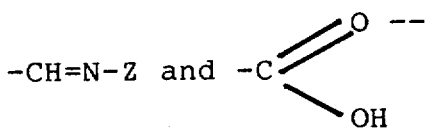 --

Signed and Sealed this

Eleventh Day of November, 1986

Attest:

DONALD J. QUIGG

Attesting Officer  Commissioner of Patents and Trademarks